(12) United States Patent
Geitner et al.

(10) Patent No.: US 8,669,655 B2
(45) Date of Patent: Mar. 11, 2014

(54) CHIP PACKAGE AND A METHOD FOR MANUFACTURING A CHIP PACKAGE

(75) Inventors: Ottmar Geitner, Pentling (DE); Walter Hartner, Bad Abbach (DE); Maciej Wojnowski, Munich (DE); Ulrich Wachter, Regensburg (DE); Michael Bauer, Undorf (DE); Andreas Stueckjuergen, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/564,922

(22) Filed: Aug. 2, 2012

(65) Prior Publication Data

US 2014/0035154 A1   Feb. 6, 2014

(51) Int. Cl.
| | |
|---|---|
| H01L 23/48 | (2006.01) |
| H01L 23/52 | (2006.01) |
| H01L 23/40 | (2006.01) |
| H01L 21/44 | (2006.01) |
| H01L 21/48 | (2006.01) |
| H01L 21/50 | (2006.01) |
| H01L 21/4763 | (2006.01) |

(52) U.S. Cl.
USPC ............ 257/692; 257/774; 257/E21.016; 257/E21.502; 257/E23.011; 438/124; 438/637

(58) Field of Classification Search
USPC ........... 257/774, 692, E21.016, E21.502, 257/E23.011; 438/124, 637
See application file for complete search history.

(56) References Cited

U.S. PATENT DOCUMENTS

| | | | | |
|---|---|---|---|---|
| 8,097,490 | B1 * | 1/2012 | Pagaila et al. | 438/106 |
| 2006/0231944 | A1 * | 10/2006 | Huang et al. | 257/706 |
| 2007/0023880 | A1 * | 2/2007 | Hess et al. | 257/678 |
| 2009/0102002 | A1 * | 4/2009 | Chia et al. | 257/433 |
| 2009/0146299 | A1 * | 6/2009 | Chen | 257/738 |
| 2009/0315170 | A1 * | 12/2009 | Shim et al. | 257/692 |
| 2010/0096734 | A1 * | 4/2010 | Abbott | 257/666 |
| 2010/0144101 | A1 * | 6/2010 | Chow et al. | 438/127 |
| 2010/0237477 | A1 * | 9/2010 | Pagaila et al. | 257/660 |
| 2010/0289095 | A1 * | 11/2010 | Poeppel et al. | 257/414 |
| 2010/0311206 | A1 * | 12/2010 | Bathan et al. | 438/107 |
| 2011/0018114 | A1 * | 1/2011 | Pagaila et al. | 257/686 |
| 2011/0147926 | A1 * | 6/2011 | Shim et al. | 257/737 |
| 2011/0209908 | A1 * | 9/2011 | Lin et al. | 174/258 |
| 2011/0221041 | A1 * | 9/2011 | Lin et al. | 257/620 |
| 2011/0221054 | A1 * | 9/2011 | Lin et al. | 257/692 |
| 2011/0233726 | A1 * | 9/2011 | Huang et al. | 257/532 |
| 2011/0233754 | A1 * | 9/2011 | Meyer-Berg | 257/693 |
| 2011/0254157 | A1 * | 10/2011 | Huang et al. | 257/737 |
| 2011/0278703 | A1 * | 11/2011 | Pagaila et al. | 257/659 |
| 2011/0298101 | A1 * | 12/2011 | Pagaila et al. | 257/659 |
| 2012/0038034 | A1 * | 2/2012 | Shin et al. | 257/676 |

(Continued)

*Primary Examiner* — David S Blum

(57) ABSTRACT

A chip package is provided, the chip package including: a chip including at least one contact pad formed on a chip front side; an encapsulation material at least partially surrounding the chip and covering the at least one contact pad; and at least one electrical interconnect formed through the encapsulation material, wherein the at least one electrical interconnect is configured to electrically redirect the at least one contact pad from a chip package first side at the chip front side to at least one solder structure formed over a chip package second side at a chip back side.

24 Claims, 5 Drawing Sheets

(56) References Cited

U.S. PATENT DOCUMENTS

| | | | |
|---|---|---|---|
| 2012/0038064 A1* | 2/2012 | Camacho et al. | 257/777 |
| 2012/0104624 A1* | 5/2012 | Choi et al. | 257/774 |
| 2012/0112328 A1* | 5/2012 | Pagaila et al. | 257/660 |
| 2012/0153472 A1* | 6/2012 | Pagaila et al. | 257/738 |
| 2012/0175779 A1* | 7/2012 | Lin | 257/773 |
| 2012/0187572 A1* | 7/2012 | Lin et al. | 257/774 |
| 2012/0199972 A1* | 8/2012 | Pagaila et al. | 257/737 |
| 2012/0208319 A1* | 8/2012 | Meyer et al. | 438/107 |
| 2012/0217645 A1* | 8/2012 | Pagaila | 257/774 |
| 2012/0223426 A9* | 9/2012 | Shim et al. | 257/737 |

* cited by examiner

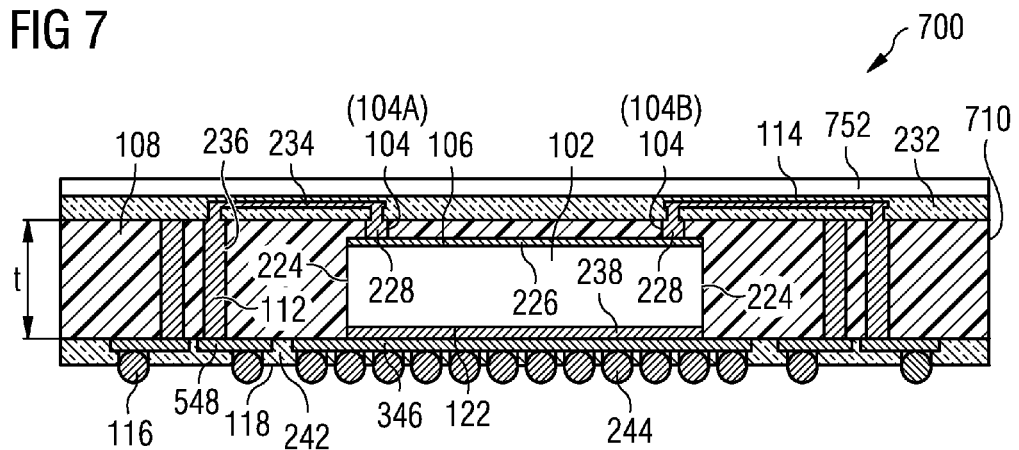
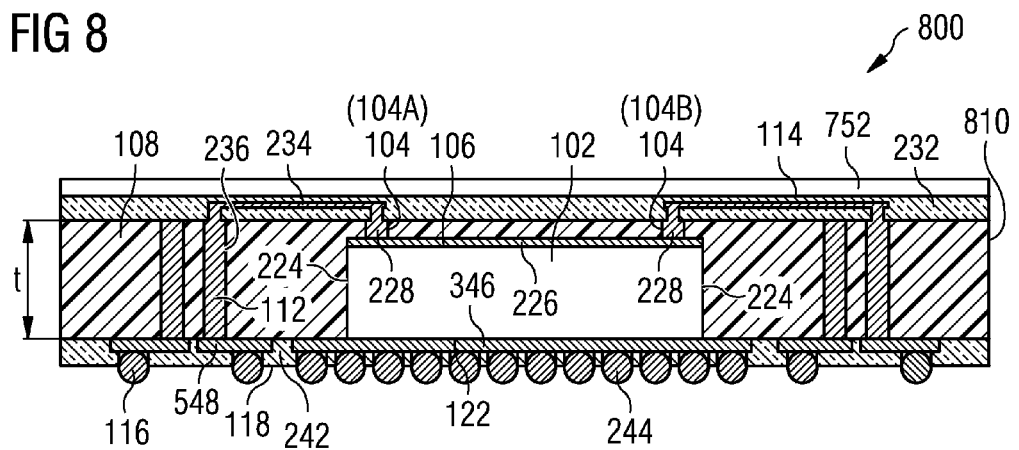
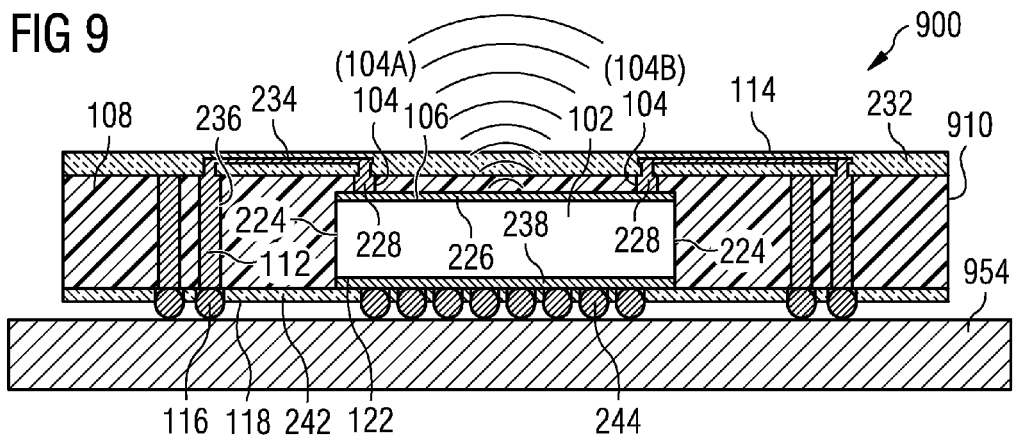

CHIP PACKAGE AND A METHOD FOR MANUFACTURING A CHIP PACKAGE

TECHNICAL FIELD

Various embodiments relate generally to a chip package and a method for manufacturing a chip package.

BACKGROUND

Many challenges are associated with heat dissipation of embedded electronic components, for example in chip packages. Particularly for embedded wafer level ball grid array packages, many challenges still exist to achieve excellent heat dissipation and cooling for chips. It may be possible that additional electrical and/or heat dissipating structures may be provided for heat dissipation. However they may result in a significantly enlarged chip package.

SUMMARY

Various embodiments provide a chip package, including: a chip including at least one contact pad formed on a chip front side; an encapsulation material at least partially surrounding the chip and covering the at least one contact pad; at least one electrical interconnect formed through the encapsulation material, wherein the at least one electrical interconnect is configured to electrically redirect the at least one contact pad from a chip package first side to at least one solder structure formed over a chip package second side at a chip back side.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a cross-sectional view of a chip package according to an embodiment;

FIG. 8 shows a cross-sectional view of a chip package according to an embodiment;

FIG. 9 shows a cross-sectional view of a chip package according to an embodiment;

DETAILED DESCRIPTION

The following detailed description refers to the accompanying drawings that show, by way of illustration, specific details and embodiments in which the invention may be practiced.

The word "exemplary" is used herein to mean serving as an example, instance, illustration or the like. Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over," is also used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Various embodiments provide a chip package, wherein a chip back side may be cooled by a mechanical connection to a substrate such as a circuit board. The mechanical connection may also serve as a bulk connection, such as a bulk electrical connection between the chip back side and the circuit board.

Various embodiments provide a chip package, wherein in contrast to current embedded wafer level ball grid array (eWLB) packages and processes, a chip may be bonded with a carrier and/or substrate, via a chip back side, and subsequently embedded. On the chip front side, die pads and/or die pad extensions, e.g. copper pillars may be formed, which may be exposed from a package back side, and which may serve as contacts. The exposed chip back side, which may also form part of the chip package front side may be mechanically connected to the substrate, and heat may be transmitted from the chip to the substrate.

Figure 1:
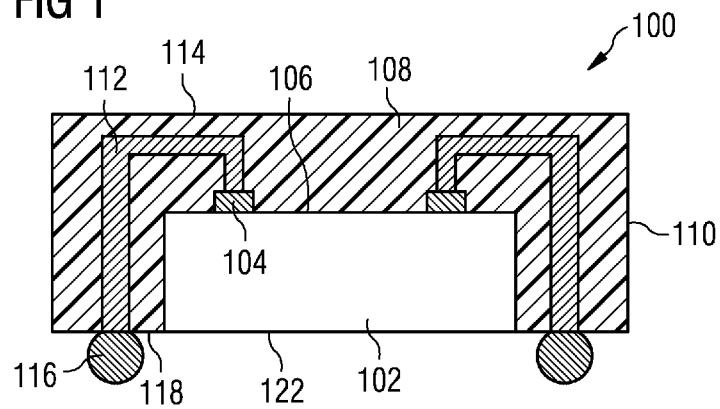
FIG. 1 shows a cross-sectional view of a chip package according to an embodiment.

FIG. 1 in view 100 shows a cross-sectional illustration of chip package 110 according to an embodiment.

Chip package 110 may include: chip 102 including at least one contact pad 104 formed on chip front side 106; encapsulation material 108 at least partially surrounding chip 102 and covering at least one contact pad 104; at least one electrical interconnect 112 formed through the encapsulation material 108, wherein at least one electrical interconnect 112 may be configured to electrically redirect at least one contact pad 104 from chip package first side 114 at chip front side 106 to at least one solder structure 116 formed over chip package second side 118 at chip back side 122.

Figure 2:
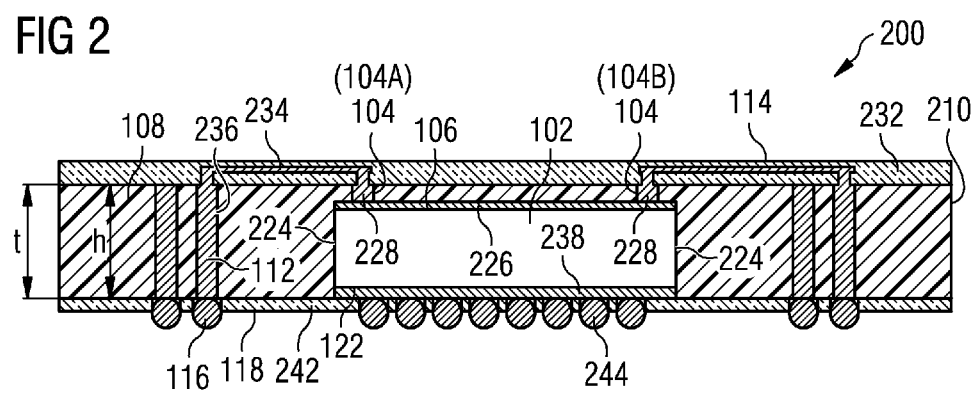
FIG. 2 shows a cross-sectional view of a chip package according to an embodiment.

FIG. 2 in view 200 shows a cross-sectional illustration of chip package 210 according to an embodiment.

Chip package 210 may include one or more or all of the features described with respect to chip package 110.

Chip package 210 may include chip 102, wherein chip 102 may include at least one contact pad 104 formed on chip front side 106. Chip 102 may include a semiconductor die, e.g. with a thickness ranging from about 50 µm to about 800 µm.

Chip front side 106 may also be referred to as a "first side", "top side" or "upper side" of the chip. The terms "top side," "first side," "front side" or "upper side" may be used interchangeably hereinafter. Chip back side 122 may also be referred to as "second side" or "bottom side" of the chip. The terms "second side," "back side," or "bottom side" may be used interchangeably hereinafter.

Chip 102 may generally include one or more electrical circuits formed in chip 102. These one or more electrical circuits (not shown) may be formed during a front end process, e.g. during front end of line (FEOL) processing. The one or more electrical circuits may generally be formed on the front side 106 of chip 102. For example, with respect to transistors and/or diodes, "top side," "first side," "front side" or "upper side" 106 may generally refer to the side of the chip or wafer wherein source/drain regions and/or gate regions may be formed. Generally "top side," "first side," "front side" or "upper side" 106 may generally refer to the side of the chip wherein bonding pads or electrical connects may be attached wherein it may be a side of the chip which may be mostly covered by metallization layers. Generally "top side," "first side," "front side" or "upper side" 106 may generally refer to the active side of the chip or wafer, or the side of the chip or wafer with most of the active structures and/or elements, or the side of the chip or wafer with electrically active structures. Power semiconductor chips may optionally also carry a back side metallization pad formed on chip back side 122. Without back side metallization, chip back side 122 may generally be free from metallic contacts and/or metallization layers.

It may be further understood that the one or more electrical circuits formed in chip front side 106 may be electrically connected to at least one contact pad formed on chip front side 106. If necessary, the one or more electrical circuits may even be electrically connected to chip back side 122. The one or more electrical circuits formed in chip front side 106 may generally be found in an active chip region 226 at chip front side 106. It may be understood that chip 102 may include more than one contact pad 104 wherein contact pads 104 may be separated and electrically insulated by passivation material. For example, at least one contact pad 104 may include a first contact pad, e.g. 104A, and a second contact pad, e.g. 104B, wherein first contact pad 104A may be electrically insulated from second contact pad 104B by passivation material formed on chip front side 106. Passivation material may include at least one of silicon nitride, silicon dioxide, polyimide. Passivation material may have a thickness ranging from about 1 nm to about 100 nm.

Encapsulation material 108 may at least partially surround chip 102 and cover at least one contact pad 104. Encapsulation material 108 may be formed over one or more sidewalls 224 of chip 102 and over chip front side 106. For example, encapsulation material 108 may cover and surround chip 102 except on chip back side 122. Encapsulation material 108 may include an electrically insulating material. For example, encapsulation material 108 may include at least one of filled or unfilled epoxy, pre-impregnated composite fibers, reinforced fibers, laminate, a mold material, a thermoset material, and a thermoplastic material. Encapsulation material 108 according to some embodiments, may be formed by molding processes, e.g. compression molding. According to other embodiments, encapsulation material 108 may be formed by lamination. Encapsulation material 108 may have a thickness t ranging from about 200 μm to about 1500 μm.

At least one electrical interconnect 112 may be formed through encapsulation material 108, wherein at least one electrical interconnect 112 may be configured to electrically redirect at least one contact pad 104 from chip package first side 114 at chip front side 106 to at least one solder structure 116 formed over chip package second side 118 at chip back side 122. The term at chip back side 122 may mean that at least one solder structure 116 may not necessarily be formed over, and/or directly on chip back side 122, but may be in the vicinity of chip back side 122. For example, at least one solder structure 116 may be adjacent to chip back side 122, or positioned on the same side of chip package 110 as chip back side 122. Chip package first side 114 may be formed over chip front side 106 and chip package second side 118 may be formed over a chip back side 122. It may be understood that chip package first side 114 may face a direction substantially opposite to a direction which chip package second side 118 faces. As a front side of a chip package may conventionally be referred to as the side over which solder structures may be formed, therefore chip package first side 114 (without solder structures) may be referred to as chip package back side, and chip package second side 118 (with solder structures) may be referred to as chip package front side.

At least one electrical interconnect 112 may have a height h which may be substantially equal to the thickness of encapsulation material 108; for example, ranging from about 200 μm to about 1500 μm.

Chip package 210 may further include at least one contact pad extension region 228 formed over at least one contact pad 104. At least one electrical interconnect 112 may be electrically connected to at least one contact pad 104 via at least one contact pad extension region 228. Contact pad extension regions 228 may be formed for example by forming one or more holes in encapsulation material 108 over contact pads 104. The one or more holes may be formed by photostructuring, e.g. chemical etching, and/or laser structuring or drilling. Contact pad extension regions 228 may be slightly larger than contact pads 104, and may be formed by depositing electrically conductive material in the one or more holes. A contact pad extension region 228 may include, for example an electrically conductive pillar, e.g. a copper pillar. Sufficiently thick encapsulation material 108 may be formed over chip front side 106. As an example, approximately 60 μm thick encapsulation material 108 may be formed over chip front side 106. Therefore, a hole through encapsulation material 108 over contact pad 114 may be filled with contact pad extension region 228, which may include, for example a 60 μm thick copper pillar. The one or more holes may be at least partially filled with electrically conductive material to form contact pad extension regions 228. Contact pad extension regions 228 may include at least one of copper, aluminum, silver, tin, gold, palladium, zinc, nickel, and iron. Contact pad extension regions 228 may be deposited, for example, by electroplating or by electroless plating. According to other embodiments, contact pad extension regions 228 may be deposited, for example, by sputtering or evaporation.

Chip package 210 may further include electrically insulating material 232 formed over encapsulation material 108 at chip package first side 114 and over chip front side 106. Electrically insulating material 232 may serve as passivation for subsequently deposited electrically conductive redistribution layers. For example, electrically insulating material 232 may include at of silicon nitride, silicon dioxide, and polyimide. Electrically insulating material 232 may be deposited over encapsulation material 108, e.g. over chip first side 106, and/or over contact pad extension regions 228. Electrically insulating material 232 may include an electrically insulating layer, having a thickness ranging from about 5 μm to several hundreds of μm, e.g. to about 300 μm, e.g. about 400 μm, and e.g. about 500 μm.

Using structuring and deposition processes, electrically conductive redistribution layers may be formed through electrically insulating material 232. It may be understood that photostructuring, e.g. photolithography, may be carried out to ensured that at least one electrically conductive redistribution layer 234 may be formed through electrically insulating material 232. For example, one or more photostructuring steps may be carried out, and one or more electrically insulating layers forming electrically insulating material 232 may be deposited. At least one electrically conductive redistribution layer 234 may be deposited, for example, by electroplating, or by electroless plating, and may include at least of copper, aluminum, silver, tin, gold, palladium, zinc, nickel, and iron. At least one electrically conductive redistribution layer 234 may electrically connect at least one contact pad 104 to at least one electrical interconnect 112. At least one electrically conductive redistribution layer 234 may be electrically insulated from each other by electrically insulating material 232.

At least one electrical interconnect 112 may include electrically conductive material formed through encapsulation material 108. At least one electrical interconnect 112 may be deposited before or after the formation of at least one electrically conductive redistribution layer 234 through electrically insulating material 232. At least one electrical interconnect 112 may include a through-mold via, which may include at least one electrical interconnect formed in at least one through-hole 236 formed in encapsulation material 108 between chip package first side 114 and chip package second side 118. At least one electrical interconnect 112 may include electrically conductive material deposited in at least one through-hole 236. At least one electrical interconnect 112 may be deposited, for example, by electroplating, e.g. by electroless plating, and/or other gap filling processes. At least one electrical interconnect 112 may include at least one of copper, aluminum, silver, tin, gold, palladium, zinc, nickel, and iron.

Chip 102 may include a chip back side metallization layer 238 formed on chip back side 122. As shown according to various embodiments, chip back side metallization layer 238 may be optionally deposited over and/or on chip back side 122. Chip back side metallization layer 238 may include at least one of copper, aluminum, silver, tin, gold, palladium, zinc, nickel, and iron. Chip back side metallization layer 238 may provide an electrical connection, e.g. to one or more electrical circuits formed at chip front side 106, e.g. at active chip region 226. For example, chip back side metallization layer 238 may provide an electrical connection to a back side source/drain region of a power semiconductor device. Chip back side metallization layer 238 may have at thickness ranging from about 5 nm to about 100 nm.

Chip package 210 may further include solder stop layer 242 formed at and/or on chip package second side 118. Solder stop layer 242 may be formed over encapsulation material 108 (from chip package second side 118) and chip back side 122. Solder stop layer 242 may include at least one material from the following group of materials, the group consisting of polymer, epoxy, photosensitive dielectrics, and polyimide. An example of a photosensitive dielectric may include WPR. Examples of polyimide may include Durimide 7320 or low temperature cure durimide 7320. An example of a polymer may include benzocyclobutene (BCB). Solder stop layer 242 may include an electrically insulating material which may electrically insulate solder structures 116 from each other. Furthermore, solder stop layer 242 may prevents the flow and/or presence of solder material in selected areas. Therefore, solder stop layer 242 may be patterned and/or structured, such that solder structures 116 may be formed in regions of chip back side 122 and/or chip package second side 118 wherein no solder stop 242 may be formed.

Solder structures 116, e.g. at least one solder structure 116, may include at least one of solder balls, solder bumps, andribbed interconnecting structures. An underbump metallization (UBM) may be formed under each solder structure 116.

As shown in FIG. 2, chip package 210, in addition to solder structure 116 formed on chip package second side 118, may include further solder structures 244 formed over chip back side 122. Chip back side metallization layer 238 may be electrically connected to at least one further solder structure 244 formed at chip package second side 118. Further solder structures 244 may be similar to solder structures 116, however, further solder structures 244, may for example be formed on chip back side metallization layer 238, unlike solder structure 116 which may be formed over encapsulation material 108 at chip package second side 118. Solder structures 116 and further solder structures 244 may include thermoballs which may be used for heat dissipation.

It may be understood, therefore, that unlike conventional eWLB packages, wherein chips may be arranged with chip front side 106 facing the PCB, various embodiments provide a chip package wherein the chip package may be arranged over a printed circuit (PCB) with chip back side 122 facing the PCB. In this way, active chip regions 226 may face away from the PCB. Furthermore, chip back side 122 may be used for heat dissipation, e.g. heat may be conducted through chip back side 122 to a PCB.

Figure 3:
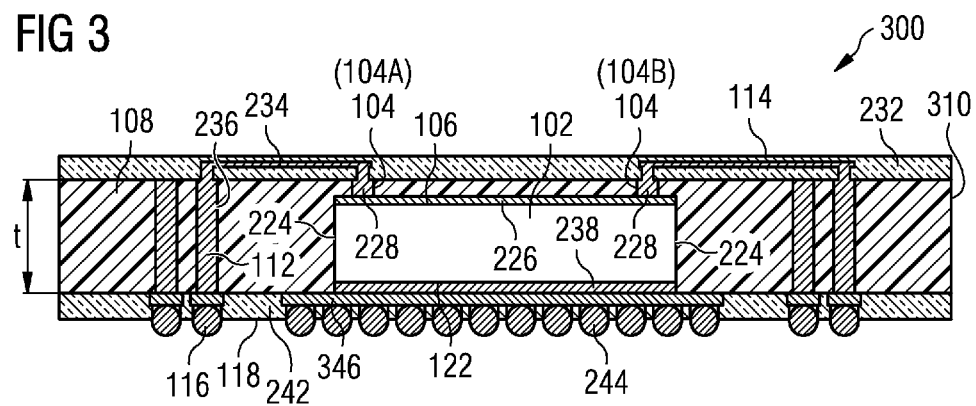
FIG. 3 shows a cross-sectional view of a chip package according to an embodiment.

FIG. 3 in view 300 shows a cross-sectional illustration of chip package 310 according to an embodiment.

Chip package 310 may include one or more or all of the features already described with respect to chip package 310, except that chip package 310 may further include extension layer 346 formed over chip back side metallization layer 238 and at least part of encapsulation material 108 from chip package second side 118. Chip back side metallization 238 may be electrically connected to at least one further solder structure 244 via extension layer 346. Extension layer 346 may include an enlarged back side cooling layer, e.g. which may be larger than chip back side 122. Extension layer 346 may improve heat dissipation away from chip back side 122 and chip package second side 118. Extension layer 346 may include at least one of copper, aluminum, silver, tin, gold, palladium, zinc, nickel, and iron. Extension layer 346 may include a heat dissipation layer, which may be used for cooling of chip back side 122.

Figure 4:
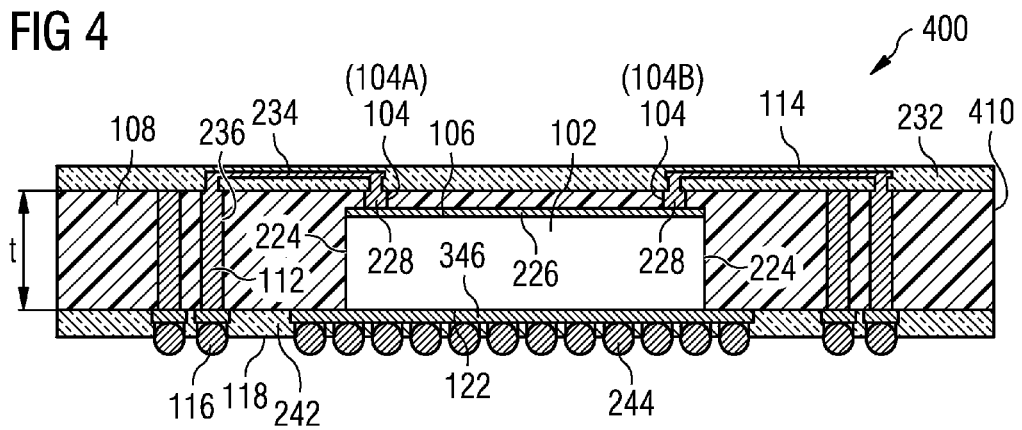
FIG. 4 shows a cross-sectional view of a chip package according to an embodiment.

FIG. 4 in view 400 shows a cross-sectional illustration of chip package 410 according to an embodiment. As shown in FIG. 4, chip package 410 may include one or more or all of the features already described with respect to chip package 310, except that chip back side metallization layer 238 may be omitted. Extension layer 346 may be formed over, e.g. directly on chip back side 122, wherein extension layer 346 may be electrically connected to at least one further solder structure 244 formed at chip package second side 118.

Figure 5:
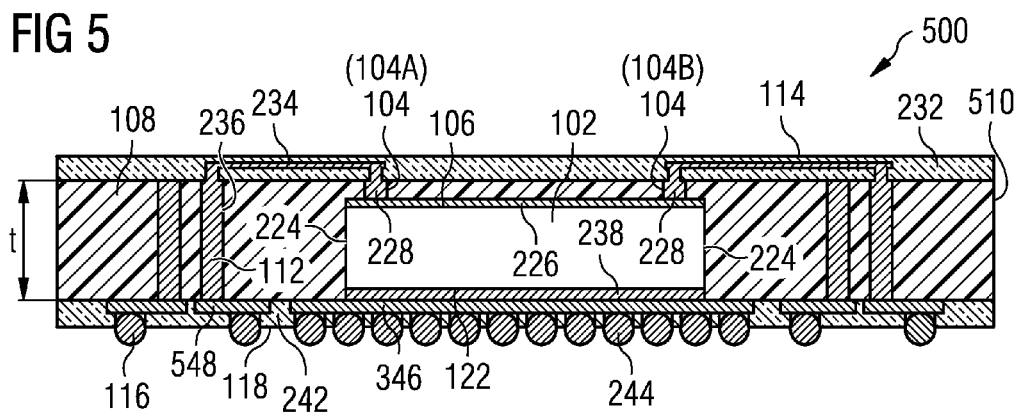
FIG. 5 shows a cross-sectional view of a chip package according to an embodiment.

FIG. 5 in view 500 shows a cross-sectional illustration of chip package 510 according to an embodiment. As shown in FIG. 5, chip package 510 may include one or more or all of the features already described with respect to chip package 310. Furthermore, chip package 510 may include at least one further electrically conductive redistribution layer 548 formed over chip package second side 118. At least one further electrically conductive redistribution layer 548 may for example, redirect the position of solder structures 116 over chip package second side 118, e.g. in fan out and/or fan in configuration. At least one further redistribution layer 548 may electrically connect at least one electrical interconnect 112 to at least one solder structure 116 arranged on a chip package second side 118. Therefore, redistribution layers 234, 548 may be formed on both side 114 and 118 of chip package 510. At least one further electrically conductive redistribution layer 548 may be formed through solder stop layer 242 or further electrically insulating material formed over chip package second side 118. At least one further electrically conductive redistribution layer 548 may be electrically insulated from each other by further electrically insulating material (analogous to electrically insulating material 232) formed over chip package second side 118.

Figure 6:
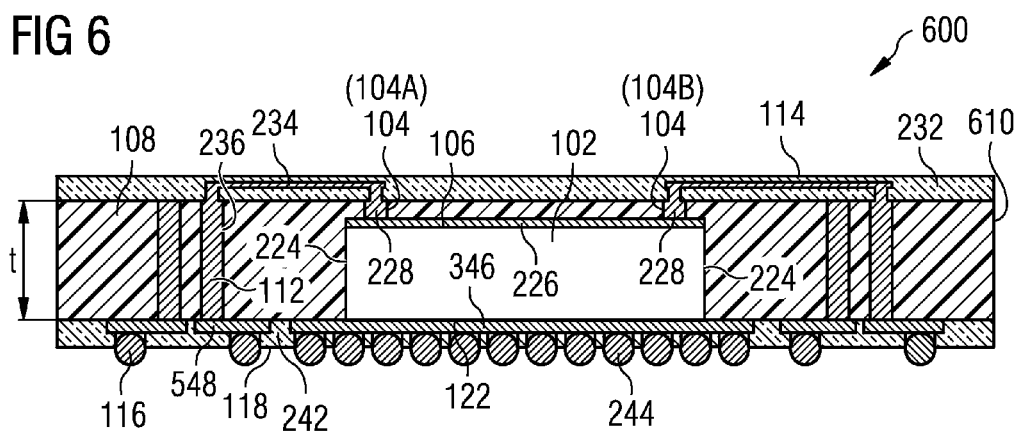
FIG. 6 shows a cross-sectional view of a chip package according to an embodiment.

FIG. 6 in view 600 shows a cross-sectional illustration of chip package 610 according to an embodiment. As shown in FIG. 6, chip package 610 may include one or more or all of the features already described with respect to chip package 510 except that chip back side metallization layer 238 may be omitted.

FIG. 7 in view 700 shows a cross-sectional illustration of chip package 710 according to an embodiment. As shown in FIG. 7, chip package 710 may include one or more or all of the features already described with respect to chip package 510. Coating layer 752 may optionally be formed over chip package first side 114, e.g. over encapsulation material 108 and/or over electrically insulating material 232 and at least one electrically conductive redistribution layer 234. Coating layer 752 may include, for example a black and/or dark material for protecting the chip package. It may be understood that coating layer 752 may optionally be formed over any of chip packages described herein, e.g. over any of chip package first sides 114.

FIG. 8 in view 800 shows a cross-sectional illustration of chip package 810 according to an embodiment. As shown in FIG. 8, chip package 810 may include one or more or all of the features already described with respect to chip package 710 except that chip back side metallization layer 238 may be omitted.

It may be understood that according to various embodiments with respect to chip packages 110, 210, 310, 410, 510, 610, 710, 810, 910, 1010, described herein, the chip packages may include a wafer level package. In other words, although only a single chip package is shown with a single chip, various embodiments may include a reconstituted wafer, e.g. including a plurality of chips, wherein the plurality of chips, e.g. one, two, three, e.g. tens, e.g. hundreds, e.g. thousands of chips, may be manufactured in a bulk wafer level process.

It may be understood that according to various embodiments with respect to chip packages 110, 210, 310, 410, 510, 610, 710, 810, 910, 1010, described herein, chip 102, e.g. a semiconductor die, may include a wafer substrate. The wafer substrate may include various materials, e.g. semiconductor materials. The wafer substrate may include at least one of Silicon, Germanium, Group III to V materials, and polymers. According to an embodiment, the wafer substrate may include doped or undoped silicon. According to another embodiment, the wafer substrate may include a silicon on insulator SOI wafer. According to an embodiment, the wafer substrate may include at least one of a semiconductor compound material, gallium arsenide (GaAs), and indium phosphide (InP). According to an embodiment, the wafer substrate may include a quaternary semiconductor compound material, e.g. indium gallium arsenide (InGaAs).

According to some embodiments, chip 102 may include a semiconductor logic chip, wherein semiconductor logic chip may include at least one of an application specific integrated circuit chip ASIC, a driver, a controller, and a sensor.

According to some embodiments, chip 102 may include a semiconductor power chip, wherein power semiconductor chip may include at least one of a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, and a gallium nitride device.

According to some embodiments, chip 102 may include active chip region 226 at chip front side 104. For example, chip 102 may include active chip region 226 at chip front side 104, wherein active chip region 226 may include a sensing region configured to at least one of receive and sense an external stimulus to be measured by chip 102. The external stimulus may include liquids and/or gases and/or solids and/or chemicals and/or biological species. For example, chip active region 226 may include an open space on chip surface, e.g. on chip front side 106 for sensing.

FIG. 9 in view 900 shows a cross-sectional illustration of chip package 910 according to an embodiment. As shown in FIG. 9, chip 102 of chip package 910 may include active chip region 226, which may be configured to at least one of transmit and receive a signal. The signal may include an electromagnetic wave signal, e.g. may include a radio frequency signal. In other words, for example, electromagnetic radiation, e.g. radio frequency radiation, may be transmitted and/or received from active chip region 226 on chip front side 106, and electromagnetic radiation may be freely transmitted and/or received from chip package first side 114. Chip 102 may be substantially free of metals on chip front side 106, which may potentially absorb, disturb or attenuate the signals to be transmitted and/or received. Therefore, chip 102 may be electrically and/or physically connected to printed circuit board (PCB) 954 via solder structures 116 and/or further solder structures 244 formed over chip package second side 118, an opposite side of chip package 910, which active chip region 226 faces. Therefore, active chip region 226 may face away from PCB 954.

Figure 10:
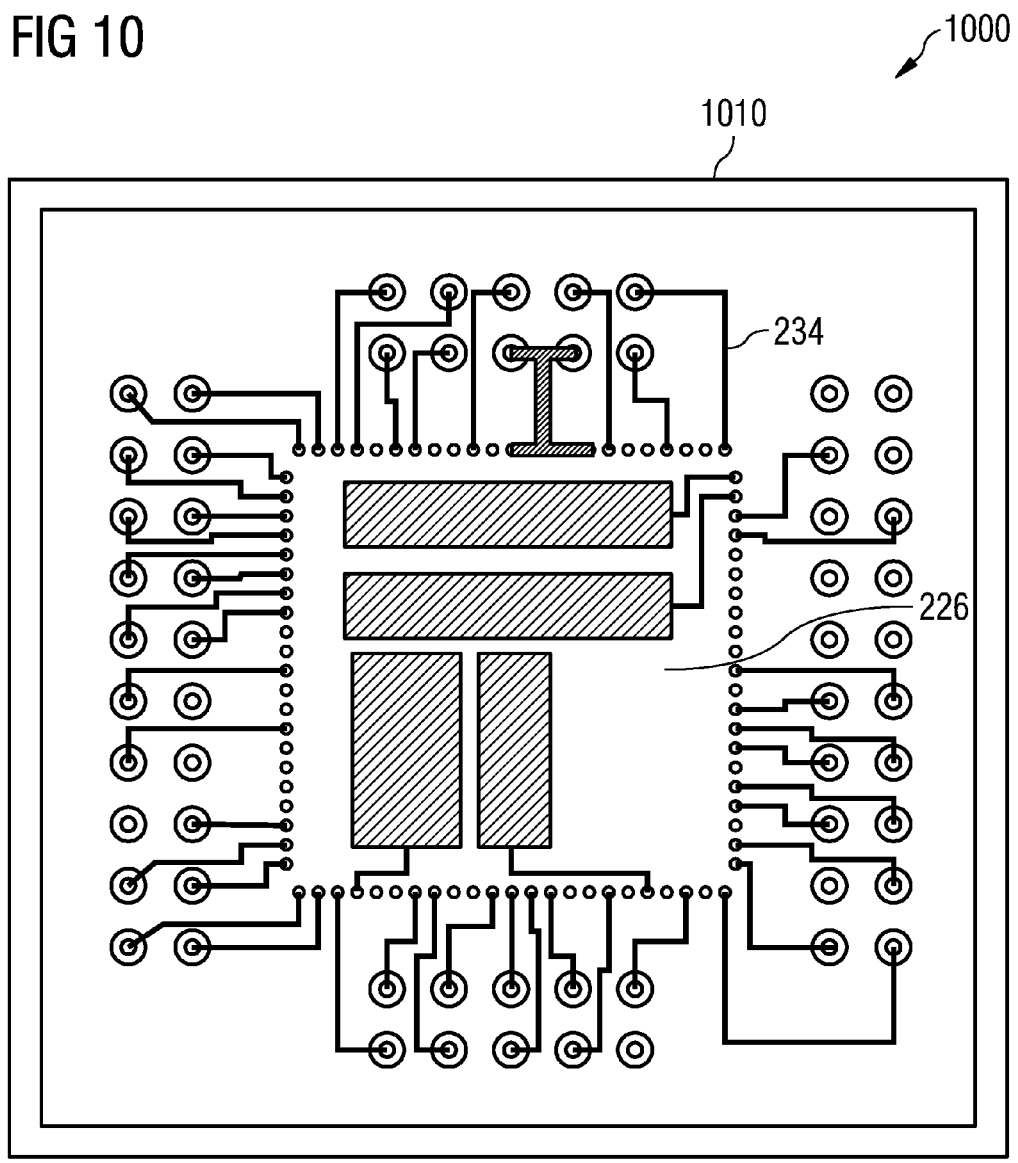
FIG. 10 shows a cross-sectional view of a chip package according to an embodiment.

FIG. 10 in view 1000 shows a top view of chip package 1010 according to an embodiment, wherein at least one electrically conductive redistribution layer 234 and active chip region 226 may be observed. As shown in FIG. 10, sufficient room may be provided on the chip package second side 118 and chip package first side 114 for active chip region 226, which may include for example, antenna structures and/or coil structures. In other words, electrical redirection of at least one contact pad 104 e.g. via at least one electrically conductive redistribution layer 234, contact pad extension region 228 and electrical interconnect 112 from chip package first side 114 to at least one solder structure 116 formed over chip package second side 118, may allow for more room for active chip region 226 at chip package first side 114, without limits due to the ball grid array layout on chip package second side 118 instead of chip package first side 114.

According to various embodiments, further cooling structures (not shown) may be formed over chip package first side 114, e.g. over electrically insulating material 232, e.g. over electrically conductive redistribution layer 234 contact pad extension region 228 and electrical interconnect 112, in various embodiments described herein. The further cooling structures may be thermally redirected from the chip package first side 114 to chip package second side 118.

Figure 11:
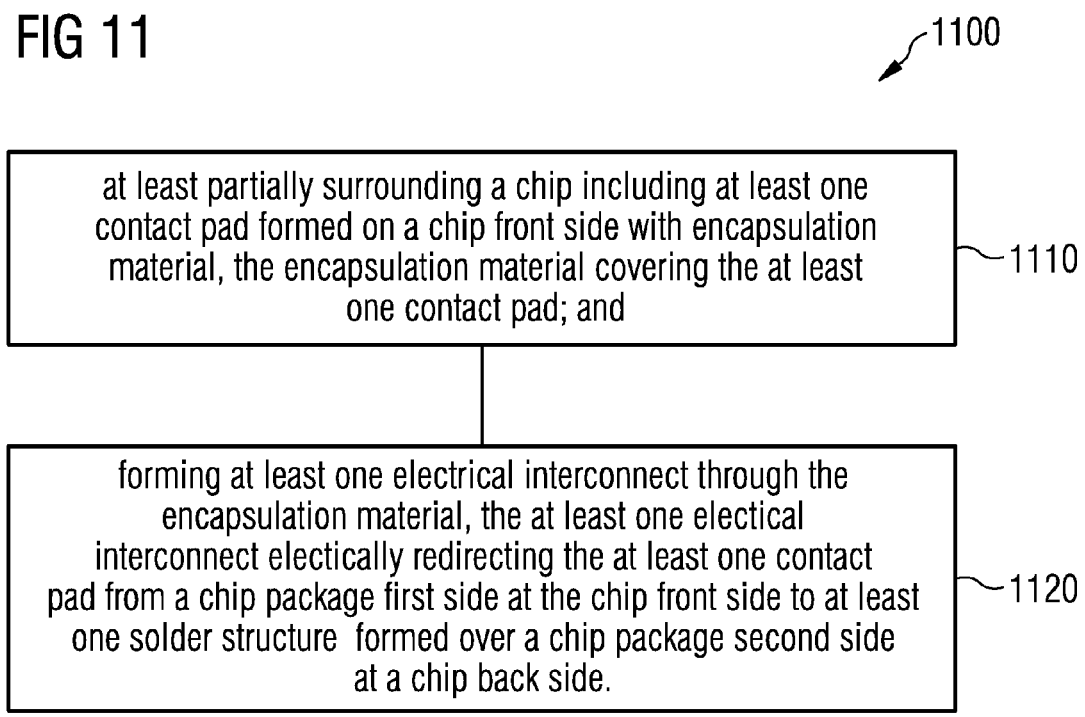
FIG. 11 shows a method for manufacturing a chip package according to an embodiment.

FIG. 11 shows method 1100 for manufacturing a chip package according to an embodiment.

Method 1100 may include:

at least partially surrounding a chip including at least one contact pad formed on a chip front side with encapsulation material, the encapsulation material covering the at least one contact pad (in 1110); and forming at least one electrical interconnect through the encapsulation material, the at least one electrical interconnect electrically redirecting the at least one contact pad from a chip package first side at chip front side to at least one solder structure formed over a chip package second side at a chip back side (in 1120).

Various embodiments provide a chip package, including: a chip including at least one contact pad formed on a chip front side; an encapsulation material at least partially surrounding the chip and covering the at least one contact pad; at least one electrical interconnect formed through the encapsulation material, wherein the at least one electrical interconnect is configured to electrically redirect the at least one contact pad from a chip package first side at the chip front side to at least one solder structure formed over a chip package second side at a chip back side.

According to an embodiment, the chip includes a semiconductor logic chip, wherein the semiconductor logic chip includes at least one of an application specific integrated circuit chip, a driver, a controller, a sensor.

According to an embodiment, the chip includes a semiconductor power chip, wherein the power semiconductor chip includes at least one of a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, and a gallium nitride device.

According to an embodiment, the chip includes an active chip region at the chip front side, wherein the active chip region is configured to at least one of transmit a signal and receive a signal.

According to an embodiment, the signal includes an electromagnetic wave signal.

According to an embodiment, the electromagnetic wave signal includes a radio frequency signal.

According to an embodiment, the chip includes an active chip region at the chip front side, wherein the active chip region includes a sensing region configured to at least one of receive an external stimulus to be measured by the chip and sense an external stimulus to be measured by the chip.

According to an embodiment, the encapsulation material is formed over one or more sidewalls of the chip and the chip front side.

According to an embodiment, the encapsulation material includes an electrically insulating material.

According to an embodiment, the encapsulation material includes at least one of filled or unfilled epoxy, pre-impregnated composite fibers, reinforced fibers, laminate, a mold material, a thermoset material, and a thermoplastic material.

According to an embodiment, the at least one contact pad includes a first contact pad and a second contact pad, wherein the first contact pad is electrically insulated from the second contact pad by passivation material formed on the chip front side.

According to an embodiment, the passivation material includes at least one of silicon nitride, silicon dioxide, and polyimide.

According to an embodiment, the chip package further includes at least one contact pad extension region formed over the at least one contact pad; wherein the at least one electrical interconnect is electrically connected to the at least one contact pad via the at least one contact pad extension region.

According to an embodiment, the chip package further includes electrically insulating material formed over the encapsulation material at the chip package first side and over the chip front side; at least one electrically conductive redistribution layer formed through the electrically insulating material; wherein the electrically conductive redistribution layer electrically connects the at least one contact pad to the at least one electrical interconnect.

According to an embodiment, the chip includes a chip back side metallization layer formed on a chip back side, wherein the chip back side metallization layer is electrically connected to at least one further solder structure formed at a chip package second side.

According to an embodiment, the chip package further includes an extension layer formed over the chip back side metallization layer, wherein the chip back side metallization is electrically connected to the at least one further solder structure via the extension layer.

According to an embodiment, the chip package further includes an extension layer formed over the chip back side, wherein the extension layer is electrically connected to at least one further solder structure formed at the chip package second side.

According to an embodiment, the chip package further includes at least one further electrically conductive redistribution layer formed over the chip package second side, wherein the at least one further redistribution layer electrically connects the at least one electrical interconnect to at least one solder structure arranged on a chip package second side.

According to an embodiment, the chip package first side is formed over the chip front side and wherein the chip package second side is formed over a chip back side.

According to an embodiment, the at least one electrical interconnect is formed in at least one through-hole formed in the encapsulation material between the chip package first side and the chip package second side.

According to an embodiment, the at least one electrical interconnect includes electrically conductive material deposited in the at least one through-hole.

According to an embodiment, the at least one solder structure includes at least one of solder balls, solder bumps, and ribbed interconnecting structures.

According to an embodiment, the chip package further includes a solder stop layer formed at the chip package second side, wherein the solder stop layer is formed over the encapsulation material and the chip back side.

Various embodiments provide a method for manufacturing a chip package, the method including: at least partially surrounding a chip including at least one contact pad formed on a chip front side with encapsulation material, the encapsulation material covering the at least one contact pad; and forming at least one electrical interconnect through the encapsulation material, the at least one electrical interconnect electrically redirecting the at least one contact pad from a chip package first side to at least one solder structure formed over a chip package second side at a chip back side.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A chip package comprising:
a chip comprising at least one contact pad formed on a chip front side;
an encapsulation material at least partially surrounding the chip and covering the at least one contact pad; and
at least one electrical interconnect formed through the encapsulation material,
wherein the at least one electrical interconnect is configured to electrically redirect the at least one contact pad from a chip package first side at the chip front side to at least one solder structure formed over a chip package second side at a chip back side being to face a substrate.
2. The chip package according to claim 1,
wherein the chip comprises a semiconductor logic chip, and wherein the semiconductor logic chip comprises at least one of an application specific integrated circuit chip, a driver, a controller, and a sensor.

3. The chip package according to claim 1,
wherein the chip comprises a semiconductor power chip, and
wherein the power semiconductor chip comprises at least one of a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, and a gallium nitride device.

4. The chip package according to claim 1,
wherein the chip comprises an active chip region at the chip front side, and
wherein the active chip region is configured to at least one of transmit a signal and receive a signal.

5. The chip package according to claim 4,
wherein the signal comprises an electromagnetic wave signal.

6. The chip package according to claim 5,
wherein the electromagnetic wave signal comprises a radio frequency signal.

7. The chip package according to claim 1,
wherein the chip comprises an active chip region at the chip front side, and
wherein the active chip region comprises a sensing region configured to at least one of receive an external stimulus to be measured by the chip and sense an external stimulus to be measured by the chip.

8. The chip package according to claim 1,
wherein the encapsulation material is formed over one or more sidewalls of the chip and the chip front side.

9. The chip package according to claim 1,
wherein the encapsulation material comprises an electrically insulating material.

10. The chip package according to claim 1,
wherein the encapsulation material comprises at least one of filled or unfilled epoxy, pre-impregnated composite fibers, reinforced fibers, laminate, a mold material, a thermoset material, and a thermoplastic material.

11. The chip package according to claim 1,
wherein the at least one contact pad comprises a first contact pad and a second contact pad, and
wherein the first contact pad is electrically insulated from the second contact pad by passivation material formed on the chip front side.

12. The chip package according to claim 11,
wherein the passivation material comprises at least one of silicon nitride, silicon dioxide, and polyimide.

13. The chip package according to claim 1, further comprising:
at least one contact pad extension region formed over the at least one contact pad;
wherein the at least one electrical interconnect is electrically connected to the at least one contact pad via the at least one contact pad extension region.

14. The chip package according to claim 1, further comprising:
electrically insulating material formed over the encapsulation material at the chip package first side and over the chip front side; and
at least one electrically conductive redistribution layer formed through the electrically insulating material;
wherein the electrically conductive redistribution layer electrically connects the at least one contact pad to the at least one electrical interconnect.

15. The chip package according to claim 1,
wherein the chip comprises a chip back side metallization layer formed on a chip back side, and
wherein the chip back side metallization layer is electrically connected to at least one further solder structure formed at a chip package second side.

16. The chip package according to claim 15, further comprising:
an extension layer formed over the chip back side metallization layer,
wherein the chip back side metallization is electrically connected to the at least one further solder structure via the extension layer.

17. The chip package according to claim 1, further comprising:
an extension layer formed over the chip back side,
wherein the extension layer is electrically connected to at least one further solder structure formed at the chip package second side.

18. The chip package according to claim 1, further comprising:
at least one further electrically conductive redistribution layer formed over the chip package second side,
wherein the at least one further redistribution layer electrically connects the at least one electrical interconnect to at least one solder structure arranged on a chip package second side.

19. The chip package according to claim 1,
wherein the chip package first side is formed over the chip front side; and
wherein the chip package second side is formed over a chip back side.

20. The chip package according to claim 1,
wherein the at least one electrical interconnect is formed in at least one through-hole formed in the encapsulation material between the chip package first side and the chip package second side.

21. The chip package according to claim 20,
wherein the at least one electrical interconnect comprises electrically conductive material deposited in the at least one through-hole.

22. The chip package according to claim 1,
wherein the at least one solder structure comprises at least one of solder balls, solder bumps, and ribbed interconnecting structures.

23. The chip package according to claim 1, further comprising:
a solder stop layer formed at the chip package second side,
wherein the solder stop layer is formed over the encapsulation material and the chip back side.

24. A method for manufacturing a chip package, the method comprising:
at least partially surrounding a chip comprising at least one contact pad formed on a chip front side with encapsulation material, the encapsulation material covering the at least one contact pad; and
forming at least one electrical interconnect through the encapsulation material, the at least one electrical interconnect electrically redirecting the at least one contact pad from a chip package first side to at least one solder structure formed over a chip package second side at a chip back side being to face a substrate.

* * * * *